US008236589B2

(12) United States Patent
Matsui et al.

(10) Patent No.: US 8,236,589 B2
(45) Date of Patent: *Aug. 7, 2012

(54) DBR LASER WITH IMPROVED THERMAL TUNING EFFICIENCY

(75) Inventors: Yasuhiro Matsui, Woburn, MA (US); Kevin J. McCallion, Charlestown, MA (US); Parviz Tayebati, Boston, MA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/839,310

(22) Filed: Jul. 19, 2010

(65) Prior Publication Data

US 2010/0279447 A1 Nov. 4, 2010

Related U.S. Application Data

(62) Division of application No. 12/102,607, filed on Apr. 14, 2008, now Pat. No. 7,760,777.

(60) Provisional application No. 60/923,370, filed on Apr. 13, 2007, provisional application No. 60/930,078, filed on May 14, 2007.

(51) Int. Cl.
*H01L 21/00* (2006.01)

(52) U.S. Cl. ............ 438/31; 438/47; 257/E33.023
(58) Field of Classification Search ............ 438/28, 438/31, 32, 81, 93; 372/39, 43.01, 44.01, 372/50.1, 50.11
See application file for complete search history.

(56) References Cited

U.S. PATENT DOCUMENTS

2007/0064759 A1 * 3/2007 Kobayashi et al. ........ 372/43.01
2010/0311195 A1 * 12/2010 Matsui et al. .................. 438/31

FOREIGN PATENT DOCUMENTS

JP 06283802 A * 10/1994
* cited by examiner

*Primary Examiner* — Brook Kebede
(74) *Attorney, Agent, or Firm* — Maschoff Gilmore & Israelsen

(57) ABSTRACT

A distributed Bragg reflector (DBR) includes a base substrate and a gain medium formed on the base substrate. A waveguide positioned above the base substrate in optical communication with the gain medium and defines a gap extending between the base substrate and the waveguide along a substantial portion of the length thereof. The waveguide having a grating formed therein. A heating element is in thermal contact with the waveguide and electrically coupled to a controller electrically configured to adjust optical properties of the waveguide by controlling power supplied to the heating element.

20 Claims, 16 Drawing Sheets

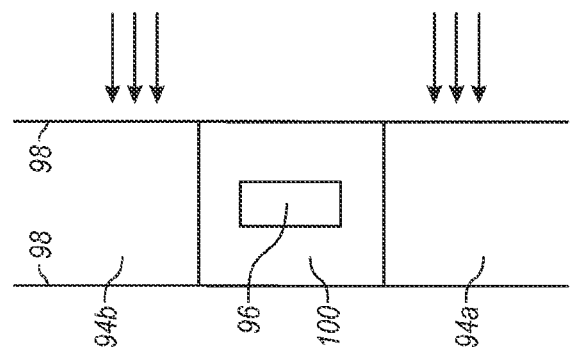
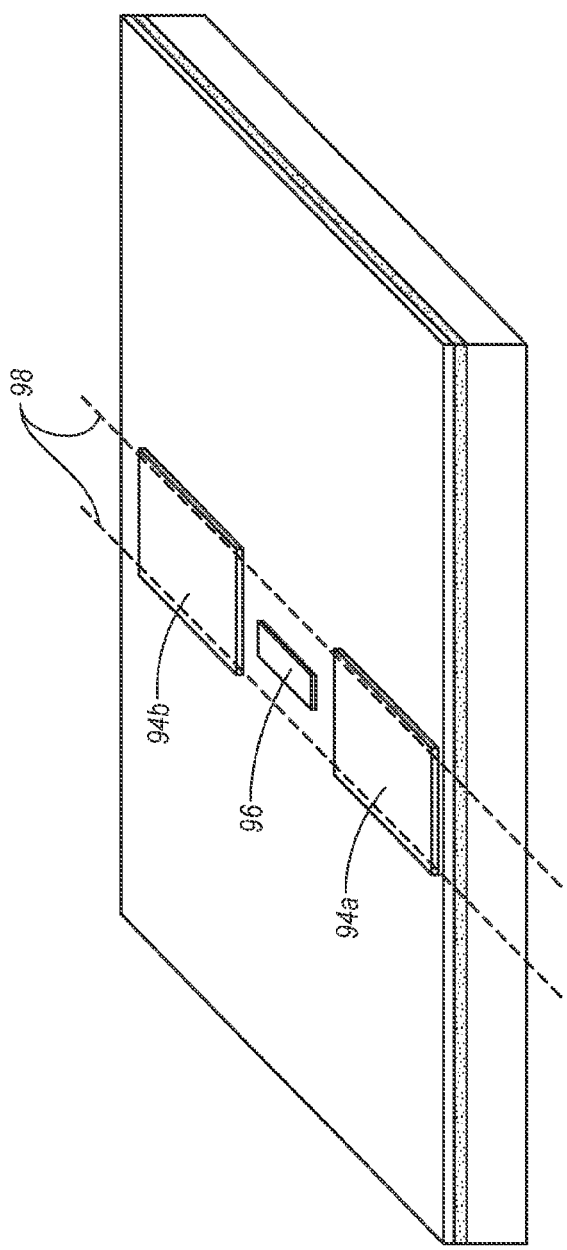
FIG. 6B
FIG. 6A

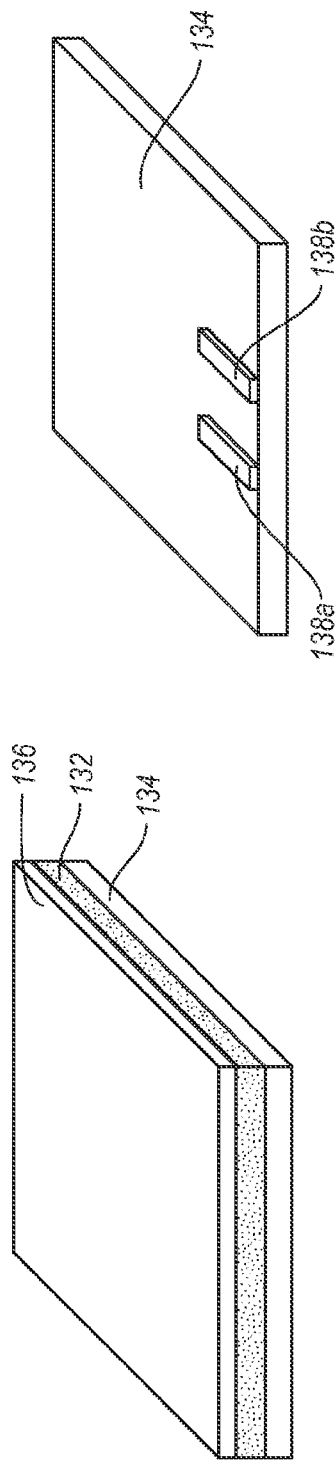
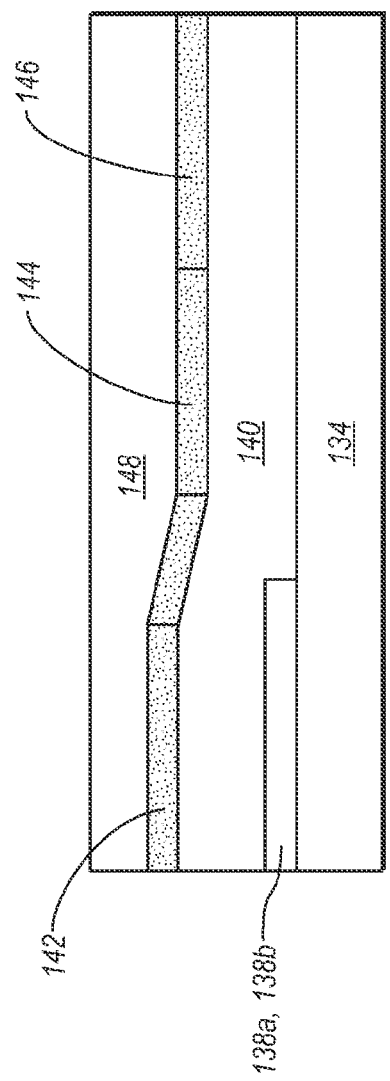

DBR LASER WITH IMPROVED THERMAL TUNING EFFICIENCY

CROSS-REFERENCE TO RELATED APPLICATIONS

This application is a divisional of, and claims priority to, U.S. application Ser. No. 12/102,607, filed on Apr. 14, 2008, entitled "DBR LASER WITH IMPROVED THERMAL TUNING EFFICIENCY," which claims the benefit of U.S. Provisional Application Ser. No. 60/923,370, filed Apr. 13, 2007 and U.S. Provisional Application Ser. No. 60/930,078, filed May 14, 2007, each of which is incorporated by reference herein.

BACKGROUND OF THE INVENTION

1. The Field of the Invention

This application relates to distributed Bragg reflector lasers and, more particularly, to systems and methods for thermal tuning of a distributed Bragg reflector.

2. The Relevant Technology

In a DBR laser, a gain medium is in optical communication with one or more grating structures that define reflection peaks that control which wavelengths of light are reflected back into the gain section and amplified or output from the laser cavity. The grating structures therefore can be used to control the output spectrum of the laser. Where two grating structures are used having different free spectral ranges, the output spectrum of the laser is determined by the alignment of the reflective spectrum of the two grating structures. The alignment of the reflection spectrum may be shifted with respect to one another to accomplish a shift in the output frequency of the laser that is much larger than the frequency shift of the reflection spectrum due to the Vernier effect.

In most DBR lasers current injection is used to tune the reflection peaks of the grating structures. However, current injection tends to degrade the materials of the DBR section over time, which limits the useful life of transmitters using current injection.

In other DBR lasers the reflection spectrum is shifted by changing the temperature of the grating structures due to the thermo-optic effect. Temperature tuning does not shorten the useful life of a DBR laser to the same extent as current injection. However, prior temperature tuning systems and methods have high power requirements, slow frequency response, and narrow tuning bands.

BRIEF SUMMARY OF THE INVENTION

In one aspect of the invention, a laser, such as a distributed Bragg reflector (DBR) laser, is formed on a base substrate comprising a semiconductor material such as InP. A gain medium is deposited on the base substrate. A wave guide is formed in optical communication with the gain section and having a substantial portion of the length thereof separated from the base substrate by a gap, which is preferably filled with air. The waveguide includes a grating structure such as a distributed Bragg reflector formed therein. A heating element is in thermal contact with the waveguide and a controller is electrically coupled to the heating element and configured to adjust optical properties of the waveguide by controlling power supplied to the heating element.

In another aspect of the invention, the waveguide is formed in a raised substrate; the raised substrate has a lower surface, with the base substrate and lower surface defining the gap between the raised substrate and the base substrate. The raised substrate further includes exposed lateral surfaces perpendicular to the lower surface.

In another aspect of the invention, the raised substrate is supported by pillars extending from the base substrate.

In another aspect of the invention, a distributed Bragg reflector for a DBR laser is manufactured by forming a first layer of a first material, such as InP, forming a second layer of a second material, such as InGaAsP, and selectively etching the second layer to form at least two discrete areas defining a gap therebetween.

Additional layers and a waveguide are then formed over the at least two discrete areas. An etching step is then performed through the additional layers to expose at least an edge of the at least two discrete areas. The at least two discrete areas are then exposed to an etchant that selectively removes the second material.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 6A and 6B illustrate alternative process steps for forming a distributed Bragg reflector supported by pillars comprising InGaAsP in accordance with an embodiment of the present invention;

FIGS. 10A through 10C illustrate process steps for forming the distributed Bragg reflector of FIG. 9;

DETAILED DESCRIPTION OF THE PREFERRED EMBODIMENTS

Figure 1:
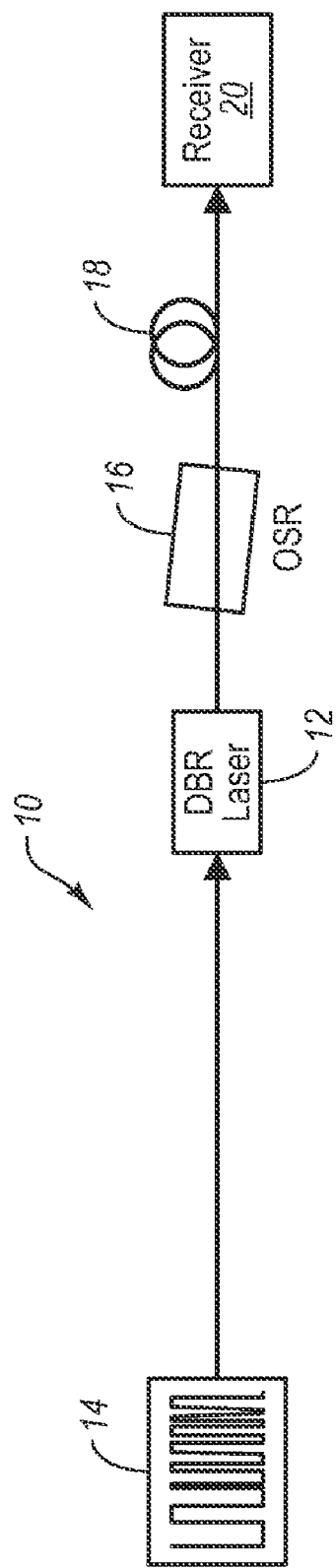
FIG. 1 illustrates a laser transmitter suitable for use in accordance with embodiments of the present invention.

Referring to FIG. 1, a transmitter system 10 may include a distributed laser 12 coupled to a data signal source 14 that supplies a modulation signal encoding binary data. The laser 12 may be a distributed Bragg reflector (DBR) laser, distributed feed back (DFB) laser, or other laser having one or more reflectors formed using a grating formed in or adjacent to a waveguide. The output of the laser 12 may be transmitted through an optical spectrum reshaper (OSR) 16. The output of the OSR 16 may be transmitted through a fiber 18 to a receiver 20. The OSR 16 converts a frequency modulated signal from the laser 12 to an amplitude modulated signal. In some embodiments, the output of the laser 12 is both frequency and amplitude modulated, such as adiabatically chirped pulses produced by a directly modulated DBR laser or distributed feedback (DFB) laser. The output of the OSR may also remain somewhat frequency modulated.

The OSR 16 may be embodied as one or more filters, including, but not limited to, a coupled multi-cavity (CMC) filter, a periodic multi-cavity etalon, a fiber Bragg grating, a ring resonator filter or any other optical element having a wavelength-dependent loss. The OSR 16 may also comprise a fiber, a Gire-Tournois interferometer, or some other element with chromatic dispersion.

In some methods of use the laser 12 is modulated between a peak and a base frequency in order to encode a data signal in the output of the laser 12. In some embodiments the output of the laser 12 will also be modulated between peak and base amplitudes. The OSR 16 has a transmission function aligned with the base and peak frequencies such that the base frequency is attenuated more than the peak frequency in order to improve the extinction ratio of the output of the OSR 16.

Figure 2:
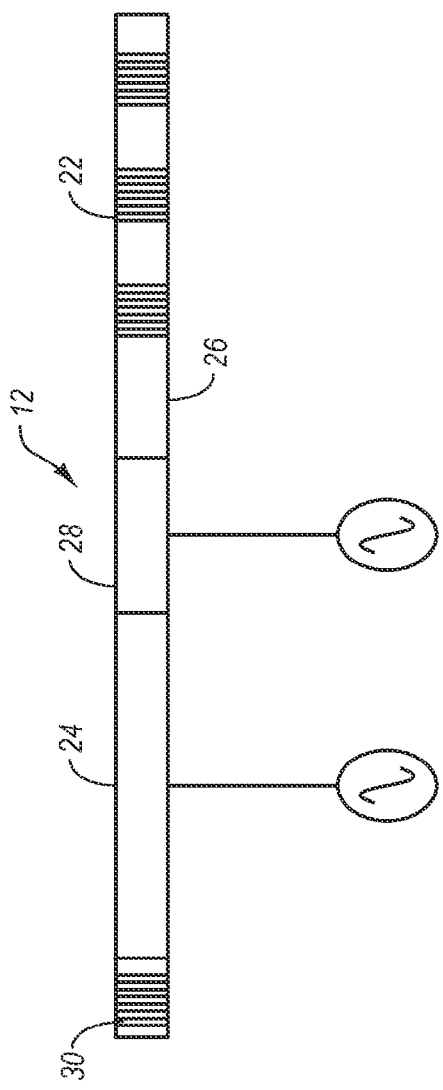
FIG. 2 illustrates a distributed Bragg reflector (DBR) laser suitable for use in accordance with embodiments of the present invention.
Figure 3:
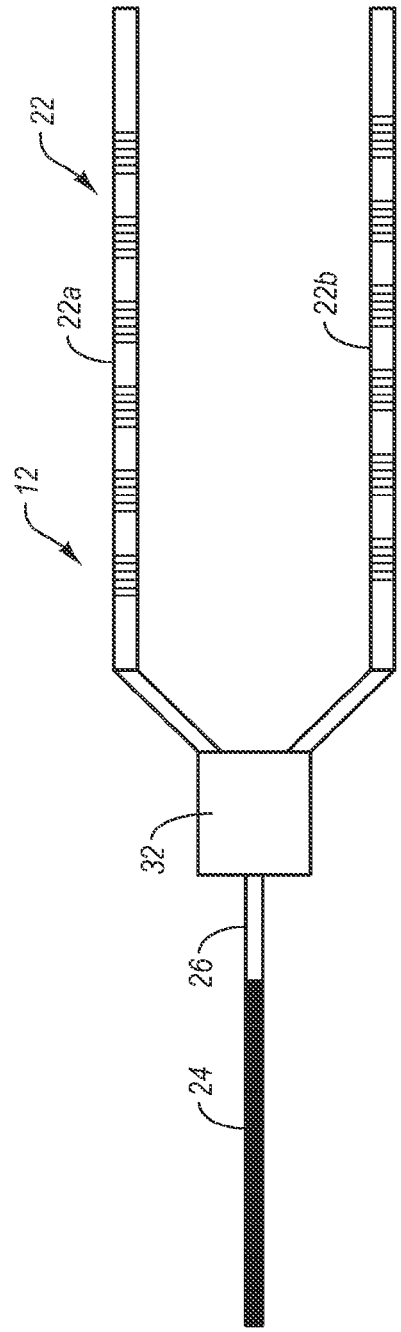
FIG. 3 illustrates a tunable twin guide sampled grating DBR laser suitable for use in accordance with embodiments of the present invention.

Referring to FIGS. 2 and 3, various DBR lasers 12 may be used with the present invention. Although FIGS. 2 and 3 illustrate two examples, they are not limiting of the type of DBR lasers that may benefit from embodiments of the present invention.

Referring specifically to FIG. 2, a DBR section 22 receives light from a gain section 24. The laser 12 may include other sections such as a phase control section 26 and/or electro-absorption section 28. The gain section 24 and other sections such as the phase control section 26 and electro-absorption section 28 may be positioned between the DBR section 22 and a filter 30. In some embodiments the filter 30 may be embodied as another DBR section.

Referring to FIG. 3, another example of a DBR laser is a tunable twin guide sampled grating DBR (TTG-SG DBR), which includes a DBR section 22 embodied as two sampled gratings 22a, 22b. The sampled gratings 22a, 22b are coupled to the gain section 24 by means of a multi-mode interface (MMI) 32. The sampled gratings 22a, 22b preferably have reflection peaks having a different free spectral range such that the reflection peaks of the combined sampled gratings 22a, 22b may be tuned using the Vernier effect.

In a DBR laser, such as those shown in FIGS. 2 and 3, a grating structure within the DBR section 22 defines reflection peaks that control which wavelengths of light are reflected back into the gain section 24. The DBR section 22 therefore determines the output spectrum of the laser. The reflection peaks of the DBR section 22 may be shifted by means of current injection or heating due to the thermo-optic effect in order to control the output spectrum of the laser.

Although current injection is a widely used means for tuning, it tends to degrade the materials of the DBR section over time, which limits the useful life of transmitters using current injection. Temperature tuning does not shorten the useful life of a DBR laser to the same extent as current injection. However, prior temperature tuning systems and methods have high power requirements, slow frequency response, and narrow tuning bands.

Figure 4:
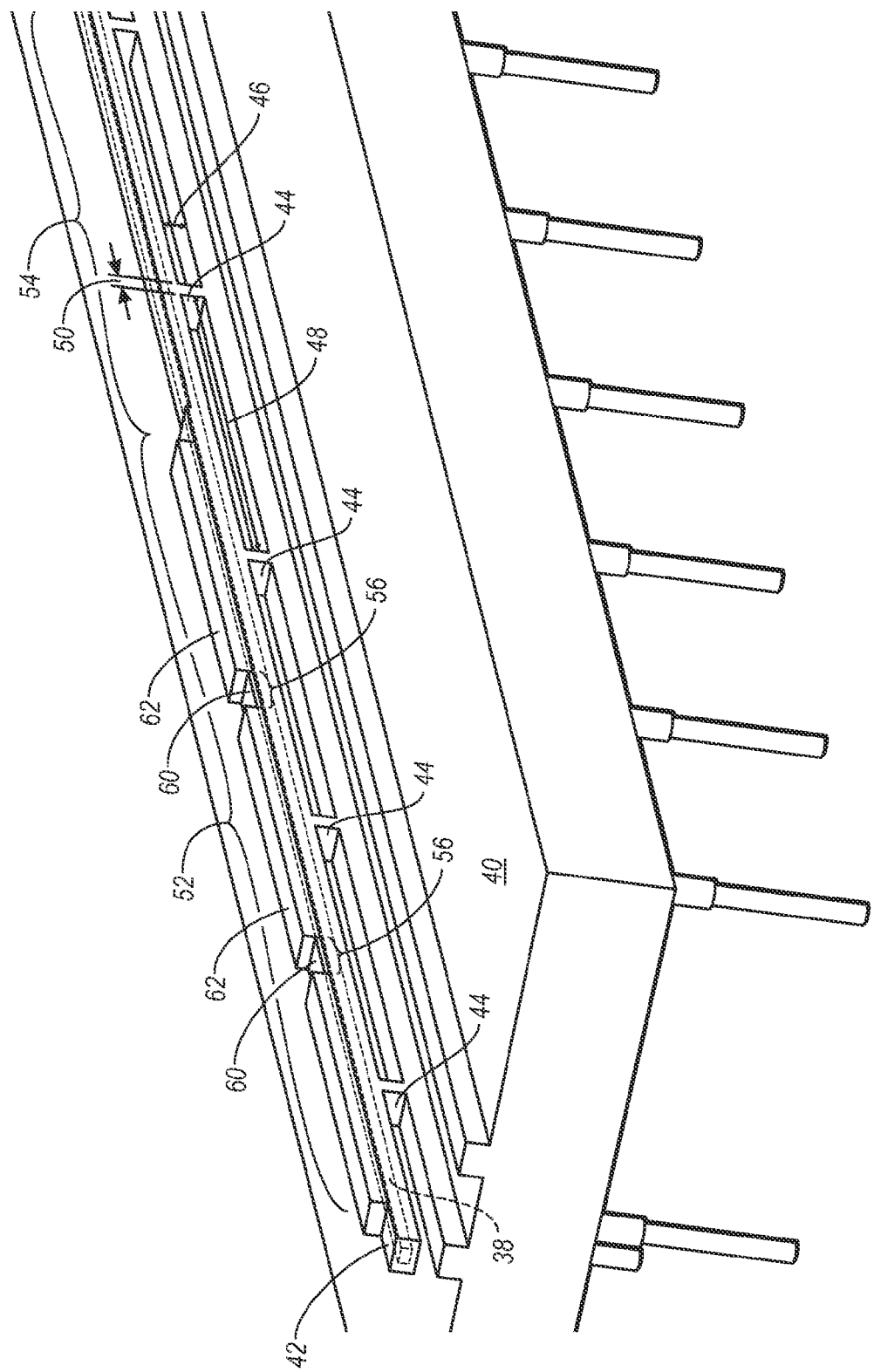
FIG. 4 is an isometric view of a distributed Bragg reflector supported above a substrate by pillars in accordance with an embodiment of the present invention.

Referring to FIG. 4, in some embodiments, a DBR section 22 may be formed in a waveguide 38 that is separated from a base substrate 40 by an air gap. In the illustrated embodiment, the waveguide 38 is formed in a raised substrate 42 supported above the base substrate by pillars 44. The pillars have a height 46 that defines the height of the air gap between the raised substrate 42 and the base substrate 40. The separation 48 between the pillars 44 is preferably much larger than the width 50 of the pillars 44 such that a majority of the length of the DBR section 22 is separated from the base substrate by an air gap. In a preferred embodiment, at least 90 percent of the length of the DBR section 22 parallel to the direction of propagation of light within the DBR section 22 is separated from the base substrate by an air gap.

The material forming the pillars 44 may be the same as, or different from, the material forming the base substrate 40 and/or raised substrate 42. For example, the pillars 44 may be formed of indium phosphide (InP), indium gallium arsenide phosphide (InGaAsP), or the like. In some embodiments 1.3 Q InGaAsP is used for the pillars 44 due to its highly insulative properties.

The raised portion 42 of the substrate may include a heated portion 52 and a non-heated portion 54. The DBR section 22 is preferably located in the heated portion whereas the gain section 24, phase section 26, and/or electro-absorption section are located in the un-heated portion 54.

In some embodiments, the DBR section 22 includes a sampled grating including gratings formed only at discrete areas 56 along the waveguide 38. In such embodiments, heaters 60 may be formed only on the discrete areas 56. The heaters 60 may be embodied as platinum stripe heaters. In such embodiments, metal layers 62, such as gold, may be deposited between the discrete areas 56 to reduce heating of other portions of the waveguide 38. In one embodiment, parallel to the optical axis of the waveguide 38, the heaters 60 have a length of about 10 μm and the metal layers 62 have a length of 70 μm. In some embodiments, the pillars 44 are located at or near a mid point between discrete areas 56, such as between 40 and 60 percent of a distance between the pillars.

The air gap insulates the waveguide 38 from the base substrate 40 and reduces the power required to raise the temperature of the waveguide 38 in order to tune the response of the DBR section 22. It also reduces the time required to raise the temperature of the waveguide 38.

Figure 5A:
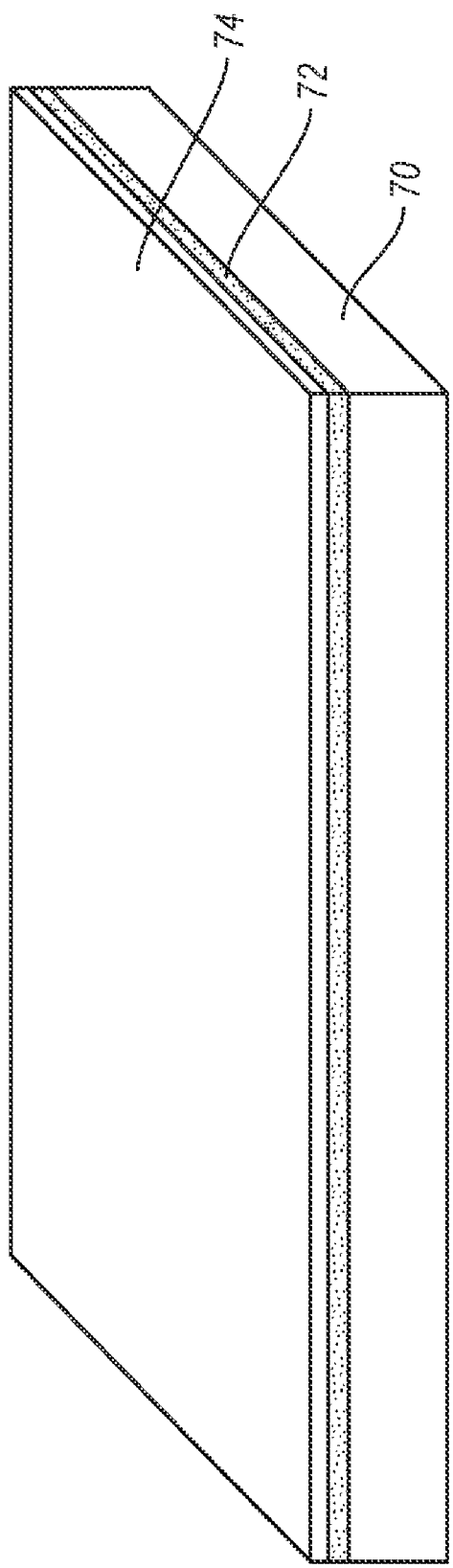
FIGS. 5A through 5G illustrate process steps for forming the distributed Bragg reflector of FIG. 4.

Referring to FIGS. 5A through 5G, an air gap may be created between the raised substrate 42 and the base substrate 40 by performing the illustrated steps. Referring specifically to FIG. 5A, an n-InP substrate 70 is formed having an InGaAsP layer 72 and n-InP layer 74 formed thereon. The InGaAsP layer 72 may be about 0.1 μm thick and the n-InP layer is preferably 30 nm thick, however other thicknesses are also possible. The InGaAsP may have a bandgap wavelength of 1.3 μm.

Figure 5B:
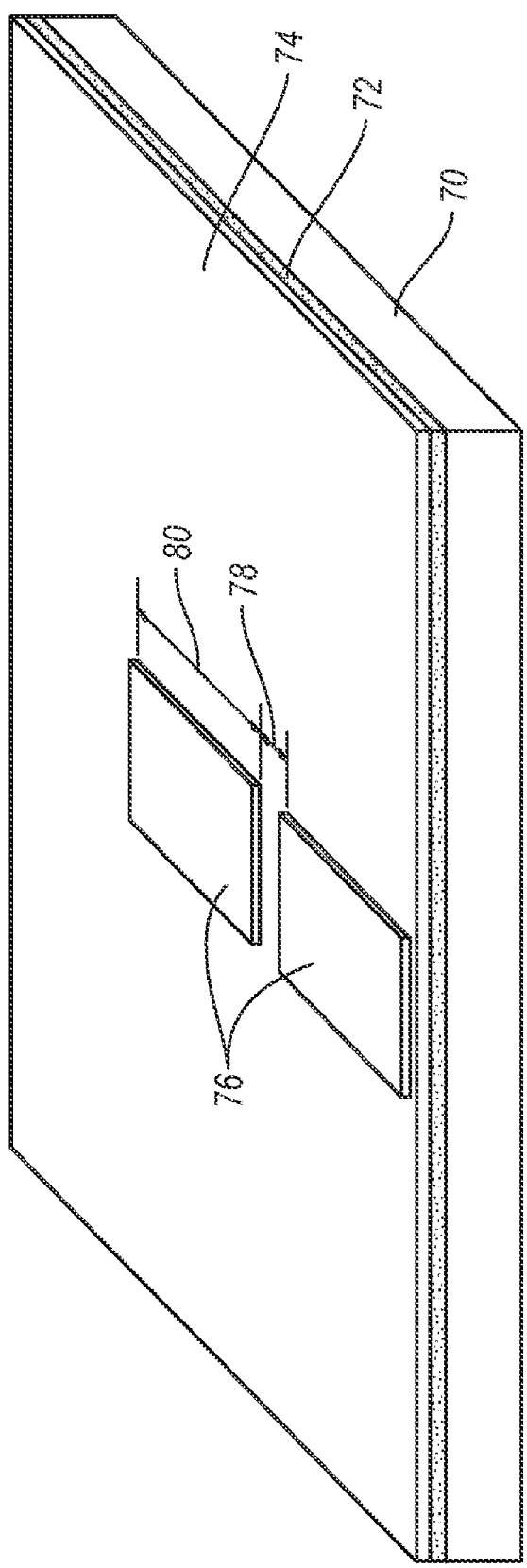

Referring to FIG. 5B, silicon oxide ($SiO_2$) areas 76 may then be formed on the upper n-InP layer 74. A gap 78 between adjacent areas 76 may have a width of 3 μm. As is apparent below, the width of the gap determines the width 50 of the pillars 44. The areas 76 have a length 80 that defines the length of the air gap between the raised substrate 42 and base substrate 40. Thus, the width of the gap 78 may be less than 90 percent of the length 80. In the illustrated embodiment, the areas 76 have a width of about 10 μm perpendicular to the optical axis of the waveguide 38 formed in subsequent steps and a length of about 30 μm parallel to the optical axis of the waveguide 38. In the illustrated example, the gap 78 is about equal to 3 μm in the direction parallel to the optical axis of the waveguide 38. Other values may be used depending on the pillar size and air gap length desired.

Figure 5C:
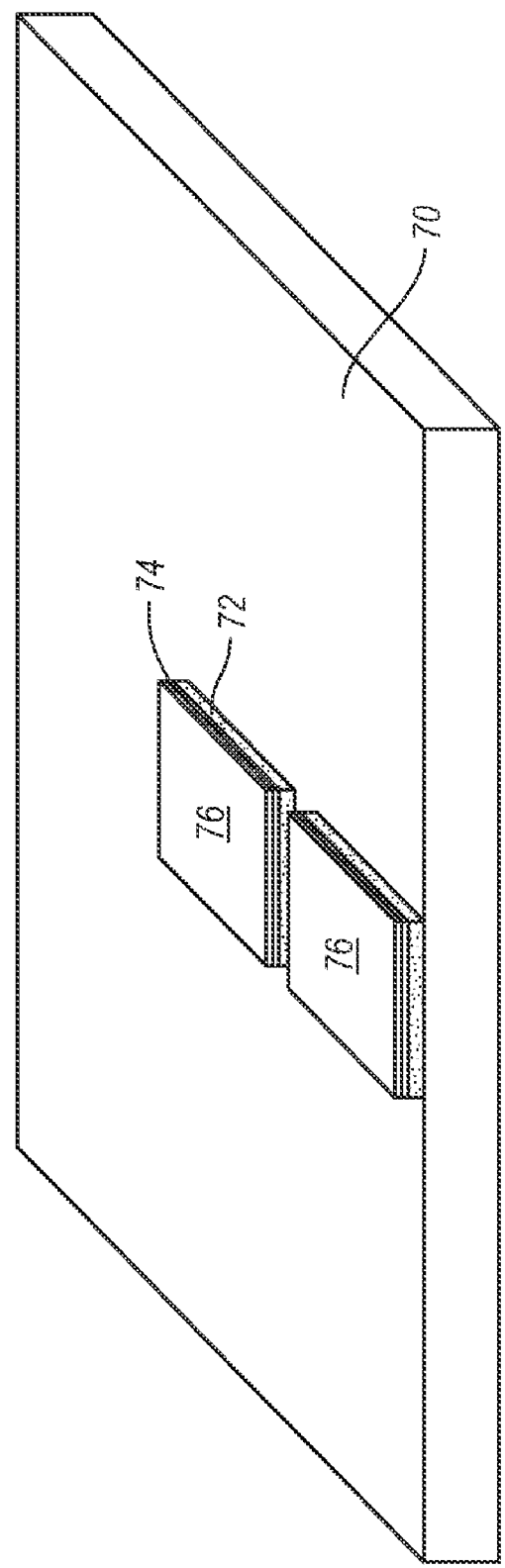

Referring to FIG. 5C, the layers of the previous figures are then selectively etched to form the structure of FIG. 5C, wherein portions of the n-InP layer 74 and InGaAsP layer 72 that are not covered by the SiO$_2$ areas 76 are etched away.

Figure 5D:
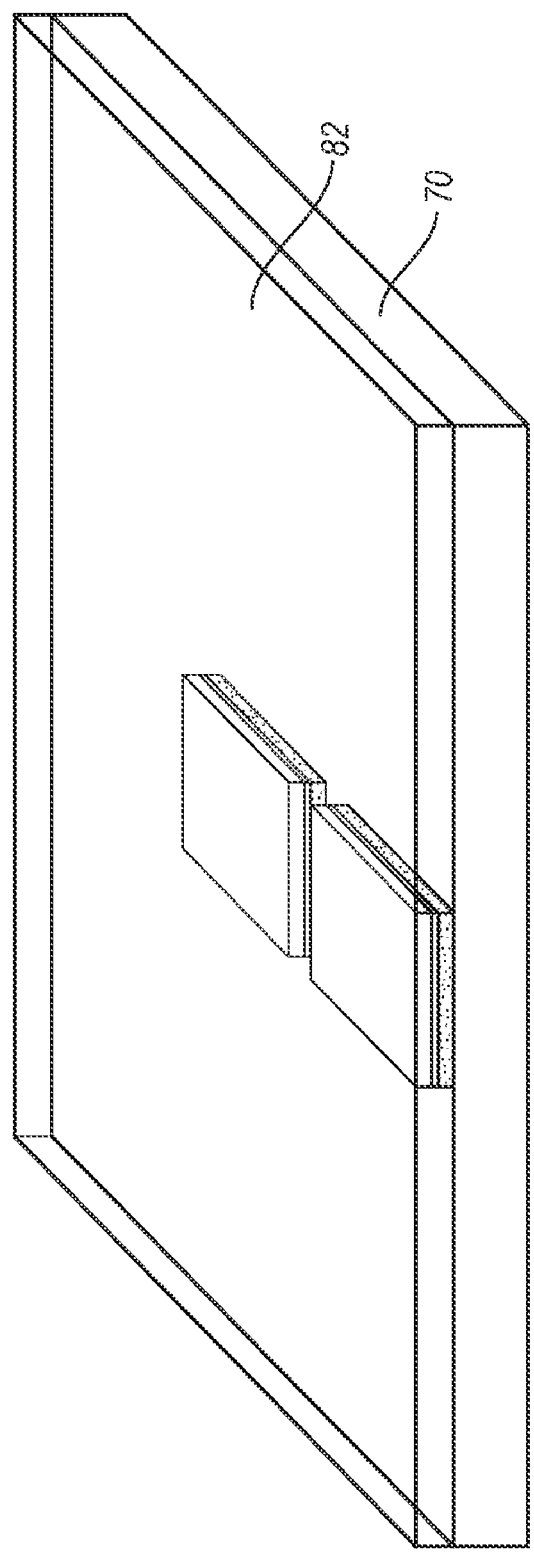
Figure 5E:
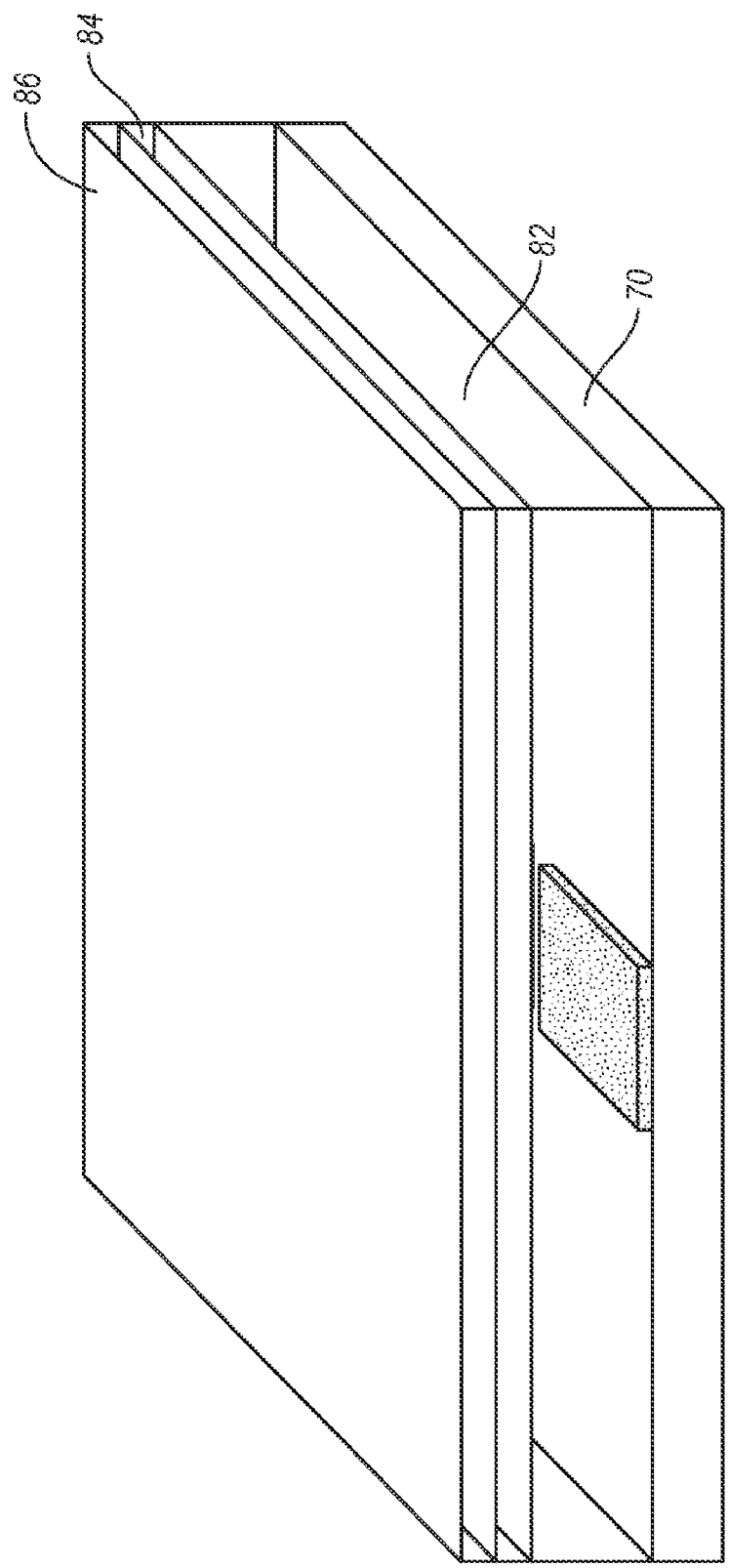
Figure 5F:
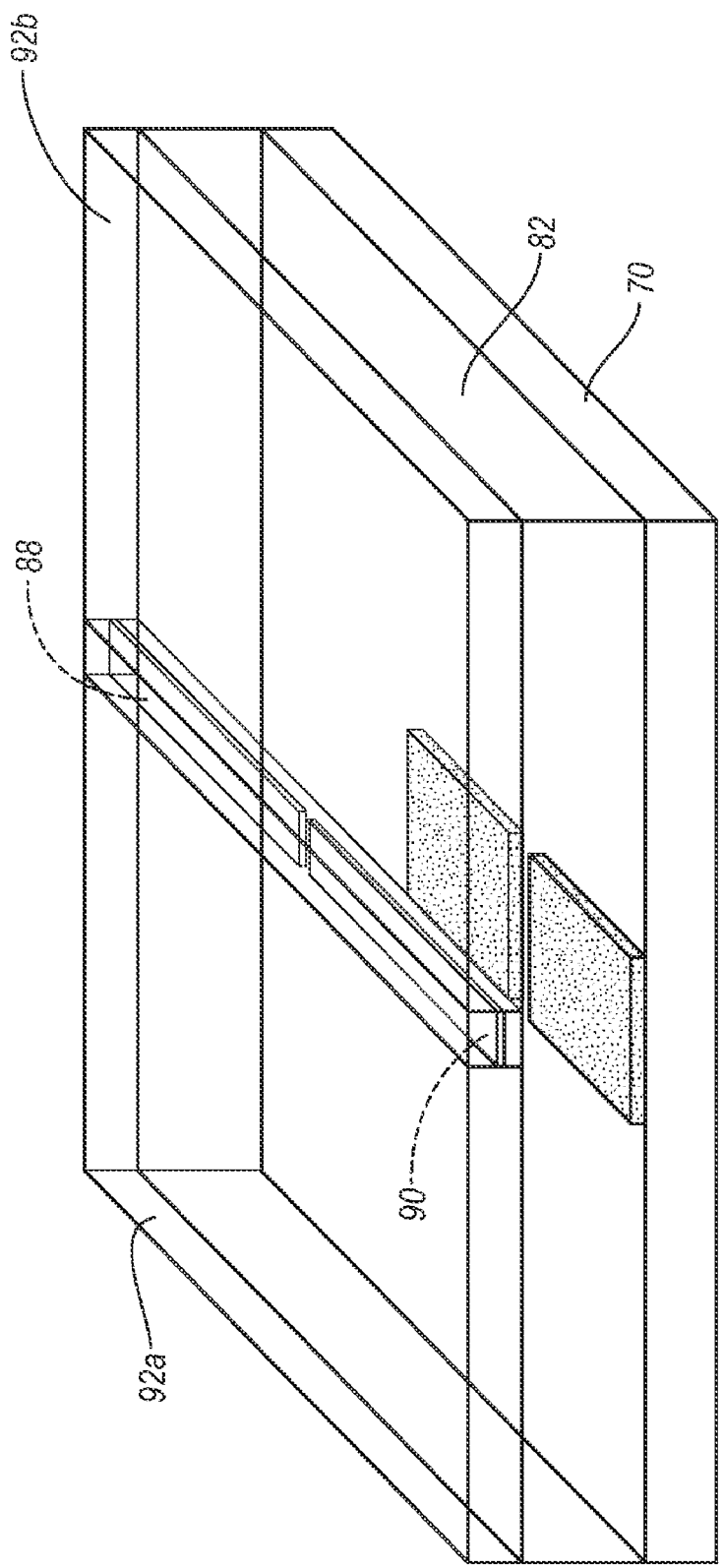

Referring to FIG. 5D, another n-InP layer 82 is grown over the remaining layers. In some embodiments the SiO$_2$ areas 76 are also removed. Referring to FIG. 5E, layers for formation of the DBR laser 12 may then be formed on the n-InP layer 82. Various layers may be grown as known in the art to form any of various types of lasers and grating structures known in the art. As an example, a multi-quantum well (MQW) layer 84 and p-InP layer 86 are grown as illustrated. In the illustrated example, the n-InP layer 86 has a thickness of about 3 μm. Referring to FIG. 5F, an active MQW portion 88 and passive DBR portion 90 may then be formed coupled to one another by a butt joint according to known methods. Fe—InP blocking portions 92a, 92b may be formed along the MQW portions 88 and passive DBR portion 90 as known in the art. The passive DBR portion 90 may be embodied as a sampled grating DBR. However, other structures may be formed as known in the art to form other laser and/or grating types Referring to FIG. 5G, the layers may then be selectively etched on either side of the DBR portion 90. The etching may be performed using dry etching, deep reactive ion etching, or the like. The volume removed during the etching step preferably extends up to and including the InGaAsP layer 72. The remaining InGaAsP layer 72 is then selectively removed in a wet etching step, such as by using an etchant that dissolves InGaAsP substantially faster than other materials forming other layers that are exposed to the etchant, such as InP. Upon removal of the InGaAsP layer, portions of the InP layer 82 between the remaining areas of the InGaAsP layers then become the pillars 44.

Referring to FIG. 6A, in an alternative embodiment, the pillars 44 include InGaAsP, rather than only InP. Such embodiments provide the advantage of having improved insulative properties, which further reduce power consumption. In such embodiments, the SiO$_2$ areas 76 illustrated in FIG. 5B are replaced with areas 94a, 94b having an area 96 positioned therebetween. The area 96 is narrower than the areas 94a, 94b and is separated from the areas 94a, 94b by a small gap.

For example, parallel to the optical axis of the waveguide 38, the area 96 is separated from each area 94a, 94b by a gap of between 10 and 25 percent of the length of the area 96. The length of the area 96 parallel to the optical axis of the waveguide 38 may be between five and ten percent of the lengths of the areas 94a, 94b. Perpendicular to the optical axis of the waveguide 38, the area 96 may have a width that is between 20 and 50 percent of the width of one of the areas 94a, 94b. In the illustrated example, parallel to the optical axis of the waveguide 38, the area 96 is separated from each area 94a, 94b by a gap of 0.5 μm and has a length of 3 μm. Perpendicular to the optical axis of the waveguide 38, the area 96 may have a width of 3 μm whereas the areas 94a, 94b have widths of 10 μm.

Figure 5G:
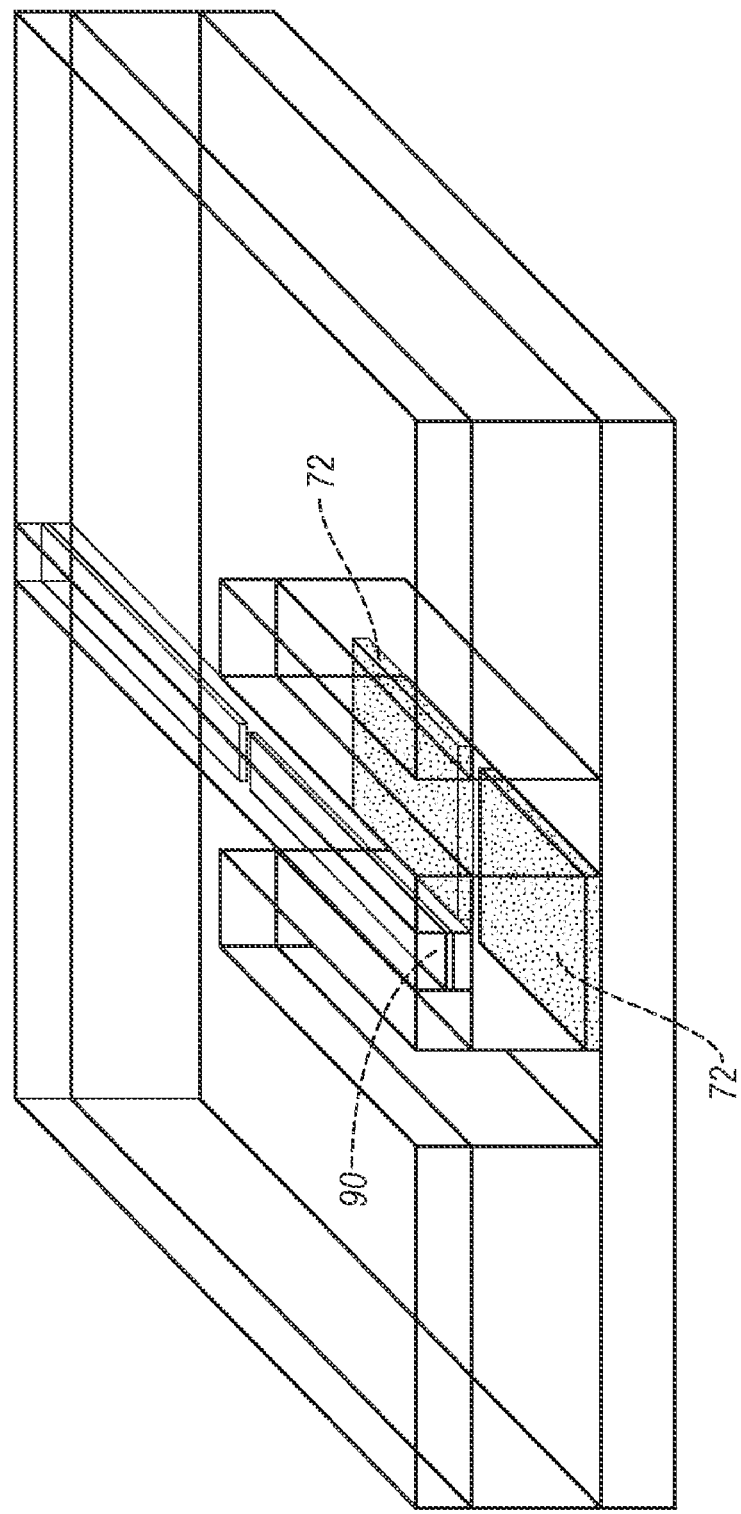

The other steps of FIGS. 5C through 5F may then be performed as described above. Referring to FIG. 6B, when the dry etching step of FIG. 5G is performed up to the lines 98, area 100 of InP remains and shields the portion of the InGaAsP layer 72 that was beneath area 96 from etching whereas the portion of the InGaAsP layer 72 that is beneath areas 94a, 94b is exposed and is etched away. Thus a pillar 44 having an InGaAsP center remains to support the raised substrate 42.

Figure 7C:
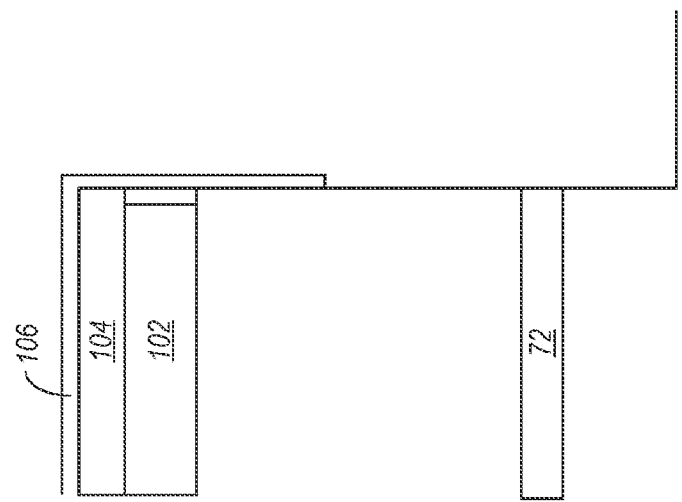
FIGS. 7A through 7C illustrate process steps for protecting an InGaAsP contact layer during formation of pillars in accordance with an embodiment of the present invention.
Figure 7B:
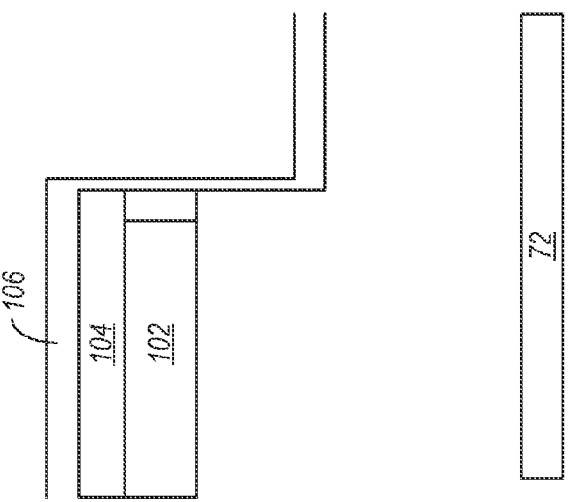
Figure 7A:
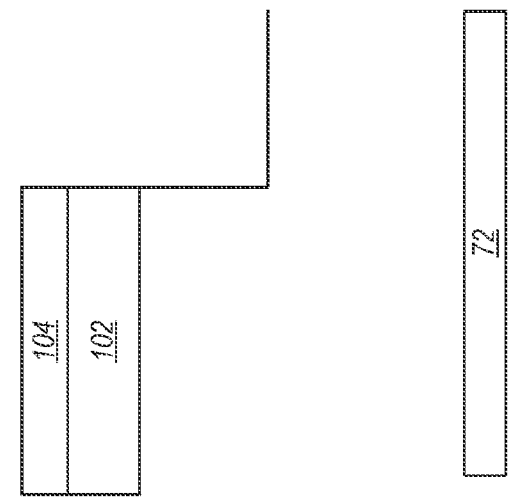

Referring to FIGS. 7A through 7C, in some laser designs, an InGaAsP contact layer 102 is formed as part of the DBR laser 12 formed in step 5F, or in another step prior to performing the steps of FIG. 5G. In such embodiments, the wet etching step of FIG. 5G using an etchant that removes InGaAsP may damage the contact layer 102. Accordingly, in such embodiments, an SiO$_2$ layer is formed to protect the contact layer prior to the etching step of FIG. 5G, In one embodiment, the protective SiO$_2$ layer is formed by forming the structure illustrated in FIG. 7A, having a thick SiO$_2$ etching mask 104 deposited on the contact layer up to the boundary where dry etching occurs in the dry etching step of FIG. 5G. A slight undercut is formed in the contact layer 102. The undercut may have, for example, a depth less than the thickness of the contact layer 102.

Figure 8:
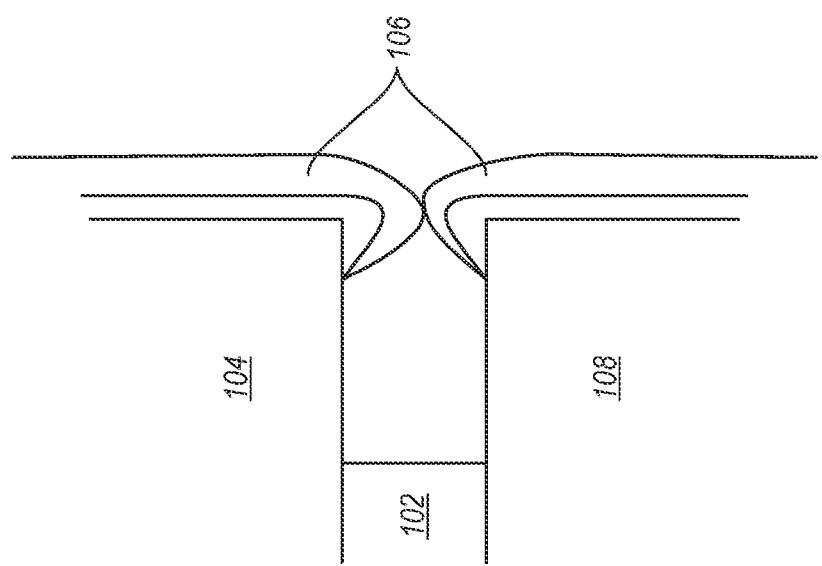
FIG. 8 is a cross sectional view of layers illustrating the formation of a protective SiO2 layer for shielding of an InGaAsP contact layer in accordance with an embodiment of the present invention.

Referring to FIG. 7B, an SiO$_2$ overcoat 106 is then formed over the SiO$_2$ etching mask 104 and surrounding exposed surfaces. Referring to FIG. 8, SiO$_2$ growth at the gap between the SiO$_2$ etching mask 104 and a layer 108 supporting the contact layer 102 projects beyond the mask 104 and 108, such that a barrier spanning the gap is formed effective to protect the InGaAsP contact layer 102.

Referring to FIG. 7C, the dry etching step of FIG. 5G progresses downwardly through the layers, removing some of the SiO$_2$ overcoat 106, especially portions on horizontal surfaces. However, vertical portions of the SiO$_2$ overcoat 106 remain and protect the InGaAsP contact layer 102 whereas the lower InGaAsP layer 72 is exposed to wet etching.

Figure 9:
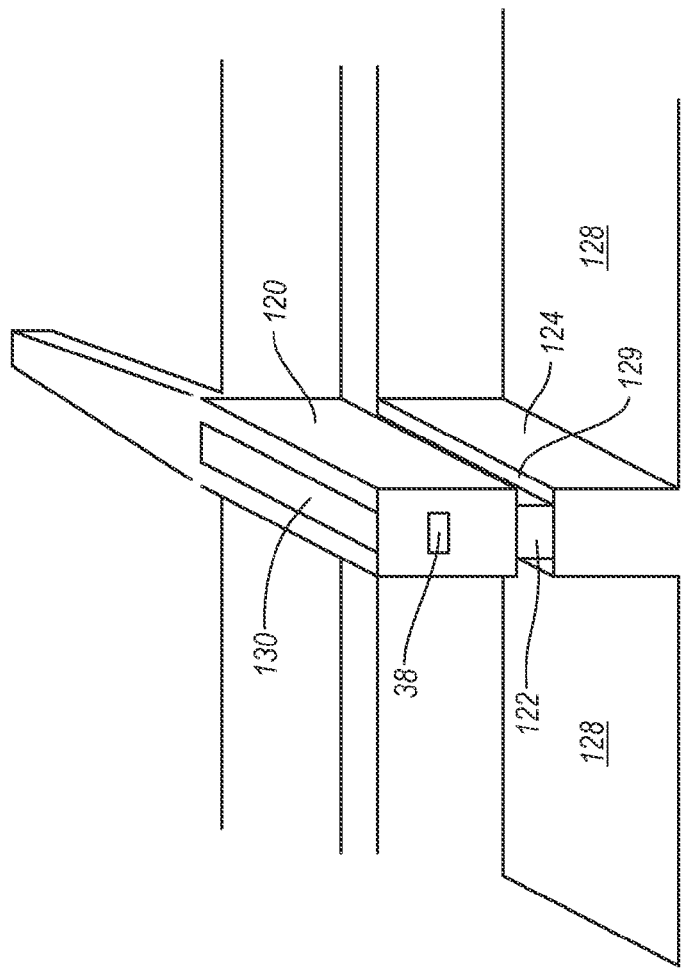
FIG. 9 is an isometric view of an alternative embodiment of a distributed Bragg reflector formed in a high-mesa structure in accordance with embodiments of the present invention.

Referring to FIG. 9, in an alternative embodiment, a waveguide 38 having a distributed Bragg reflector formed therein is embedded within a high-mesa structure that isolates the waveguide 38 in order to improve thermal tuning efficiency. In the illustrated embodiment, the waveguide 38 is formed in an upper layer 120 of a multi layer structure. An insulative layer 122 is formed between the upper layer 120 and a lower layer 124. In some embodiments, the upper layer 120 and lower layer 124 are formed of InP whereas the insulative layer 122 includes 1.3Q InGaAsP, which has much lower thermal conductivity than InP. In the illustrated embodiment, the insulative layer 122 has a height of 0.8 μm and a width of 3 μm, whereas the upper and lower layers 120, 124 have widths of 5 μm. The combined height of the layers 120, 122, 124 is 5 μm in the illustrated example.

Areas 128 one either side of the waveguide 38 are etched, such as by dry etching to expose vertical faces of the upper layer 120 and lower layer 124. In some embodiments, only layers 120 and 122 such that the lower layer 124 does not include exposed faces parallel to the exposed vertical faces of the upper layer 120. The insulative layer 124 may be etched to form an undercut 129 between the upper layer 120 and lower layer 124 to further decrease the thermal conductivity therebetween. A heater 130, such as a platinum stripe heater, may be deposited on the upper layer 120 to control the temperature of the waveguide 38.

Referring to FIG. 10A, the high-mesa structure of FIG. 9 may be formed by first forming a 1.3Q InGaAsP layer 132 on an InP substrate 134. A second InP layer 136 is then formed on the layer 134. Referring to FIG. 10B, the structure of FIG. 10A, is masked and etched to form parallel areas 138a, 138b of 1.3Q InGaAsP positioned in correspondence to the DBR reflectors of a DBR laser 12. Referring to FIG. 10C, an InP spacer layer 140 is then formed over the InP layer 134 and 1.3Q InGaAsP areas 138a, 138b. One or more DBR sections 142, a multi-mode interface (MMI) 144, and a gain section 146 may then be formed on the InP spacer layer 140. An additional InP layer 148 may be formed over the DBR sections 142 and MMI 144. As is apparent in FIG. 10C, the DBR 142 and MMI 144 are offset from one another due to the thickness of the InGaAsP areas 138a, 138b, which may result in some coupling losses. However, the InP spacer layer 140 is preferably sufficiently thick to reduce losses to acceptable levels.

Figure 11:
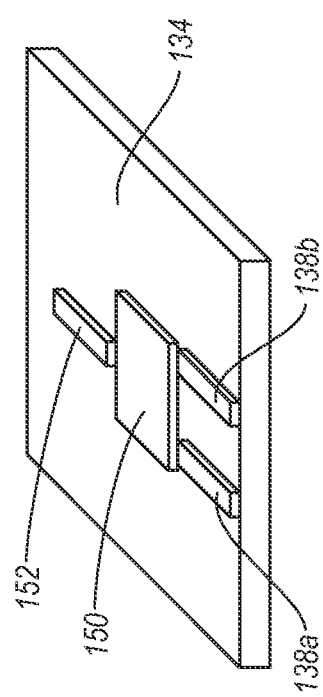
FIG. 11 illustrates an alternative process for forming the distributed Bragg reflector of FIG. 9.

Referring to FIG. 11, in an alternative embodiment, alignment between the DBR sections 142 and the MMI 144 may be improved by creating additional areas 150 and 152 of 1.3Q InGaAsP positioned under the MMI 144 and gain section 146, respectively. Inasmuch as the area 152 under the gain section 146 is embedded within surrounding InP layer in the final product, heat is able to dissipate from the gain section not withstanding the presence of the 1.3Q InGaAsP area 152.

Figure 12A:
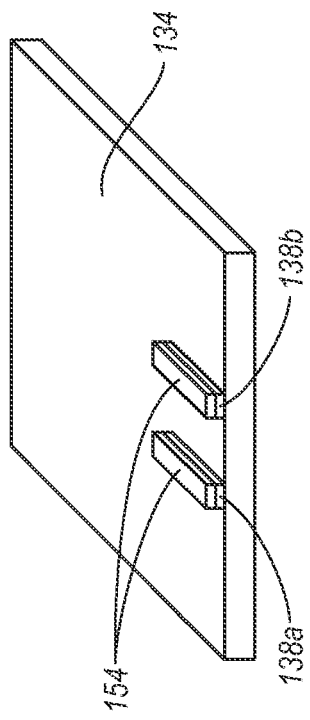
FIGS. 12A and 12B illustrate another alternative process for forming the distributed Bragg reflector of FIG. 9.
Figure 12B:
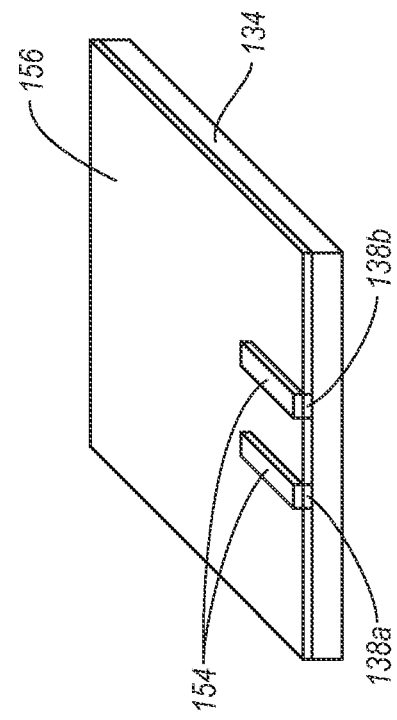

Referring to FIGS. 12A and 12B, in an alternative embodiment, coupling between the DBR sections 142 and the MMI 144 is improved by performing a planarizing step prior to formation of the DBR sections 142 and MMI 144. For example, the InGaAsP layer 132 and second InP layer 136, such as are shown in FIG. 10A, may be selectively etched to leave areas 138a, 138b of the InGaAsP layer 132. A mask layer 154 may be formed over the areas 152. Alternatively the layer 154 may include portions of the second InP layer 136 that remain after selective etching. A third InP layer 156 is then selectively grown around the areas 138a, 138b and the upper surface of the layers is then planarized. The DBR sections 142, MMI 144, and gain section 146 are then formed having the DBR sections formed over the areas 138a, 138b.

Figure 13:
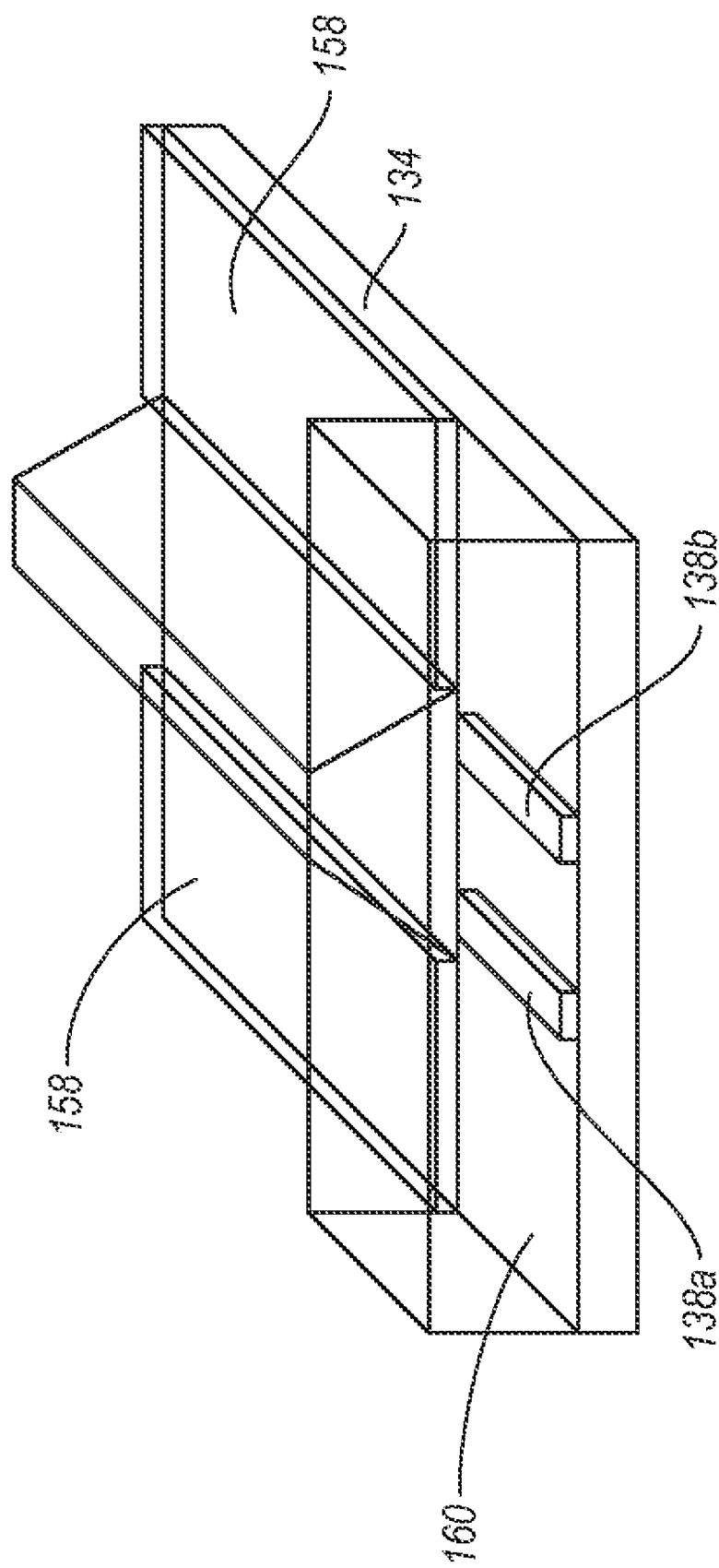
FIG. 13 illustrates another alternative process for forming the Distributed Bragg reflector of FIG. 9.

Referring to FIG. 13, in another alternative embodiment, following the selective etching step of FIG. 10B that forms form parallel areas 138a, 138b, areas 158 of a masking material, such as SiO$_2$, are formed adjacent an area where the MMI 144 and gain section 146 are formed in subsequent steps. A third InP layer 160 is then grown over areas not covered by the areas 158 of masking material, including over the areas where the MMI 144 and gain section 146 are formed and over the parallel areas 138a, 138b of 1.3Q InGaAsP. The third InP layer 160 is then planarized and the DBR sections 142, MMI 144, and gain section 146 are formed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for forming an optical device comprising:
    forming a first layer formed of a first material;
    forming a second layer formed of a second material different from the first material on the first layer;
    selectively etching the second layer to form at least two discrete areas each having a length along a first direction and separated from one another by a first distance along the first direction;
    forming at least one additional layer of a third material different from the second material on the at least two discrete areas;
    forming a waveguide on the at least one additional layer;
    removing a portion of the at least one additional layer adjacent the waveguide such that at least a portion of each of the at least two discrete areas is exposed; and
    exposing the at least two discrete areas to etchant that removes the second material faster than the first and third materials.

2. The method of claim 1, wherein the first and third material are identical.

3. The method of claim 1, wherein the first and third materials are InP and wherein the second material is InGaAsP.

4. The method of claim 1, wherein the length of the discrete areas is 90 percent larger than the first distance.

5. The method of claim 1, wherein selectively etching the second layer to form at least two discrete areas further comprises selectively etching the second layer to form a third discrete area between the first and second areas, the third discrete area separated from the first and second discrete areas by third and fourth distances, respectively, along the first direction, the third discrete area having a width smaller than that of the first and second discrete areas along a direction perpendicular to the first direction.

6. The method of claim 1, wherein the first and third materials are InP and the second material is InGaAsP, the method further comprising, prior to performing the step of removing a portion of the at least one additional layers adjacent the waveguide:
    forming a contact layer comprising InGaAsP over the at least one additional layers;
    forming a first SiO$_2$ layer over the InGaAsP layer;
    etching away at least one edge of the contact layer; and
    growing a second SiO$_2$ layer having a portion extending entirely across the at least one edge of the InGaAsP layer.

7. The method of claim 1, comprising creating an air gap between a raised substrate and a base substrate.

8. The method of claim 1, comprising:
    forming the first layer as a substrate with n-InP as the first material;
    forming the second layer on the first layer with InGaAsP as the second material;
    forming a first n-InP layer on the second layer;
    forming at least two silicon oxide areas on the first n-InP layer each having the length along the first direction and separated from one another by the first distance along the first direction;
    selectively etching the first n-InP layer and second layer so as to form the at least two discrete areas each having the length along the first direction and separated from one another by the first distance along the first direction;
    forming at least one additional layer of n-InP as the third material on the at least two discrete areas and areas that were selectively etched; and
    forming the waveguide on the at least one additional layer of n-InP, wherein the waveguide includes at least one multi-quantum well (MQW) portion and at least one distributed Bragg reflector (DBR) portion coupled together with at least one butt joint.

9. The method of claim 8, comprising:
forming Fe—InP blocking portions along the at least one MWQ portion and at least one DBR portion;
removing a portion of the Fe—InP blocking portions and the at least one additional layer of n-InP adjacent the DBR portion by selectively etching on both sides of the such that the at least a portion of each of the at least two discrete areas is exposed; and
exposing, by wet etching, the at least two discrete areas to a wet etchant that removes the InGaAsP of the second layer faster than the n-InP of the first and third layers such that portions of the third layer of n-InP become pillars.

10. The method of claim 8 comprising forming a multi-quantum well (MQW) layer on the additional layer of n-InP.

11. The method of claim 10, comprising optionally forming a second n-InP layer on the multi-quantum well (MQW) layer.

12. The method of claim 8, comprising removing the silicon oxide areas.

13. The method of claim 9, wherein the pillars include InGaAsP and InP.

14. The method of claim 9, wherein the pillars include InP and are substantially devoid of InGaAsP.

15. The method of claim 9, wherein the removed InGaAsP become air gaps.

16. The method of claim 1, comprising:
forming the first layer as a substrate with n-InP as the first material;
forming the second layer on the first layer with InGaAsP as the second material; and
forming at least two areas aver the second layer each having the length along the first direction and separated from one another by the first distance along the first direction.

17. The method of claim 16, comprising:
selectively etching the second layer so as to form the at least two discrete areas each having the length along the first direction and separated from one another by the first distance along the first direction.

18. The method of claim 17, comprising:
forming at least one additional layer of the third material on the at least two discrete areas and areas that were selectively etched; and
forming the waveguide on the at least one additional layer of the third material, wherein the waveguide includes at least one multi-quantum well (MQW) portion and at least one distributed Bragg reflector (DBR) portion coupled together with at least one butt joint.

19. The method of claim 18, comprising:
forming blocking portions along the at least one MWQ portion and at least one DBR portion;
removing a portion of the blocking portions and the at least one additional layer of the third material adjacent the DBR portion by selectively etching on both sides of the such that the at least a portion of each of the at least two discrete areas is exposed; and
exposing, by wet etching, the at least two discrete areas to a wet etchant that removes the InGaAsP of the second layer faster than the first and third materials such that portions of the at least one additional layer of the third material become pillars.

20. The method of claim 19, wherein the removed InGaAsP become air gaps between the pillars.

* * * * *